(12) United States Patent
Hush et al.

(10) Patent No.: US 7,002,833 B2
(45) Date of Patent: Feb. 21, 2006

(54) COMPLEMENTARY BIT RESISTANCE MEMORY SENSOR AND METHOD OF OPERATION

(75) Inventors: Glen Hush, Boise, ID (US); Jake Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/866,091

(22) Filed: Jun. 14, 2004

(65) Prior Publication Data

US 2005/0018509 A1    Jan. 27, 2005

Related U.S. Application Data

(63) Continuation of application No. 09/988,627, filed on Nov. 20, 2001, now Pat. No. 6,791,859.

(51) Int. Cl.
  *G11C 17/00* (2006.01)
(52) U.S. Cl. .................. 365/100; 365/148; 365/222
(58) Field of Classification Search ................ 365/205, 365/100, 222, 148
  See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,112,512 A | 9/1978 | Arzubi et al. |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |

(Continued)

FOREIGN PATENT DOCUMENTS

EP    1109170    6/2001

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Richard Elms
*Assistant Examiner*—N. Nguyen
(74) *Attorney, Agent, or Firm*—Dickstein Shapiro Morin & Oshinsky LLP

(57) ABSTRACT

A method and apparatus are disclosed for sensing the resistance state of a resistance-based memory element using complementary resistance-based elements, one holding the resistance state being sensed and the other holding a complementary resistance state. A sense amplifier detects voltages discharging through the high and low resistance elements to determine the resistance state of an element being read.

32 Claims, 6 Drawing Sheets

U.S. PATENT DOCUMENTS

| | | | |
|---|---|---|---|
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,699,293 A | 12/1997 | Tehrani et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,883,827 A | 3/1999 | Morgan |
| 5,896,312 A | 4/1999 | Kozicki et al. |
| 5,903,504 A * | 5/1999 | Chevallier et al. .......... 365/207 |
| 5,912,839 A | 6/1999 | Ovshinsky et al. |
| 5,914,893 A | 6/1999 | Kozicki et al. |
| 5,914,902 A * | 6/1999 | Lawrence et al. .......... 365/201 |
| 5,920,788 A | 7/1999 | Reinberg |
| 5,933,365 A | 8/1999 | Klersy et al. |
| 5,936,880 A | 8/1999 | Payne |
| 5,936,882 A | 8/1999 | Dunn |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,191,972 B1 | 2/2001 | Miura et al. |
| 6,191,989 B1 | 2/2001 | Luk et al. |
| 6,236,059 B1 | 5/2001 | Wolstenholme et al. |
| 6,243,311 B1 | 6/2001 | Keeth |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,314,014 B1 | 11/2001 | Lowrey et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,981 B1 | 10/2002 | Numata et al. |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,490,190 B1 | 12/2002 | Ramcke et al. |
| 6,501,111 B1 | 12/2002 | Lowrey |
| 6,507,061 B1 | 1/2003 | Hudgens et al. |
| 6,511,862 B1 | 1/2003 | Hudgens et al. |
| 6,511,867 B1 | 1/2003 | Lowrey et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowrey et al. |
| 6,555,860 B1 | 4/2003 | Lowrey et al. |
| 6,563,164 B1 | 5/2003 | Lowrey et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowrey |
| 6,576,921 B1 | 6/2003 | Lowrey |
| 6,577,525 B1 * | 6/2003 | Baker .......................... 365/148 |
| 6,586,761 B1 | 7/2003 | Lowrey |
| 6,589,714 B1 | 7/2003 | Maimon et al. |
| 6,590,807 B1 | 7/2003 | Lowrey |
| 6,593,176 B1 | 7/2003 | Dennison |
| 6,597,009 B1 | 7/2003 | Wicker |
| 6,605,527 B1 | 8/2003 | Dennison et al. |
| 6,608,773 B1 * | 8/2003 | Lowrey et al. ............. 365/100 |
| 6,613,604 B1 | 9/2003 | Maimon et al. |
| 6,621,095 B1 | 9/2003 | Chiang et al. |
| 6,625,054 B1 | 9/2003 | Lowrey et al. |

| | | | |
|---|---|---|---|
| 6,642,102 B1 | 11/2003 | Xu | |
| 6,646,297 B1 | 11/2003 | Dennison | |
| 6,649,928 B1 | 11/2003 | Dennison | |
| 6,667,900 B1 | 12/2003 | Lowrey et al. | |
| 6,671,710 B1 | 12/2003 | Ovshinsky et al. | |
| 6,673,648 B1 | 1/2004 | Lowrey | |
| 6,673,700 B1 | 1/2004 | Dennison et al. | |
| 6,674,115 B1 | 1/2004 | Hudgens et al. | |
| 6,687,153 B1 | 2/2004 | Lowrey | |
| 6,687,427 B1 | 2/2004 | Ramalingam et al. | |
| 6,690,026 B1 | 2/2004 | Peterson | |
| 6,696,355 B1 | 2/2004 | Dennison | |
| 6,707,712 B1 | 3/2004 | Lowery | |
| 6,714,954 B1 | 3/2004 | Ovshinsky et al. | |
| 6,757,784 B1 * | 6/2004 | Lu et al. .................. | 711/118 |
| 2002/0000666 A1 | 1/2002 | Kozicki et al. | |
| 2002/0027805 A1 * | 3/2002 | Roohparvar ............ | 365/185.18 |
| 2002/0057594 A1 * | 5/2002 | Hirai ....................... | 365/171 |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Kozicki | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/035401 A1 | 2/2004 | Ramachandran et al. | |

FOREIGN PATENT DOCUMENTS

| | | |
|---|---|---|
| JP | 56126916 | 10/1998 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S. R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskil, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near=1/3 In GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17$^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen In the crystallization of silicon nitride-doped chalocgenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system—Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.
Fleury, G.; Hamou, A.; Viger, C.; Vautier, C., Conductivity and crystallization of amorphous selenium, Phys. Stat. Sol. (a) 64 (1981) 311-316.
Fritzche, H, Optical and electrical energy gaps in amorphous semiconductors, J. Non-Cryst. Solids 6 (1971) 49-71.
Fritzche, H., Electronic phenomena in amorphous semiconductors, Annual Review of Materials Science 2 (1972) 697-744.
Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.
Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.
Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.
Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.
Gupta, Y.P., On electrical switching and memory effects in amorphous chalcogenides, J. Non-Cryst. Sol. 3 (1970) 148-154.
Haberland, D.R.; Stiegler, H., New experiments on the charge-controlled switching effect in amorphous semiconductors, J. Non-Cryst. Solids 8-10 (1972) 408-414.
Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.
Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.
Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.
Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.
Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.
Hayashi, T.; Ono, Y.; Fukaya, M.; Kan, H., Polarized memory switching in amorphous Se film, Japan. J. Appl. Phys. 13 (1974) 1163-1164.
Hegab, N.A.; Fadel, M.; Sedeek, K., Memory switching phenomena in thin films of chalcogenide semiconductors, Vacuum 45 (1994) 459-462.
Helbert et al., *Intralevel hybrid resist process with submicron capability,* SPIE vol. 333 Submicron Lithography, pp. 24-29 (1982).
Hilt, DISSERTATION: *Materials characterization of Silver Chalcogenide Programmable Metalization Cells,* Arizona State University, pp. Title page-114 (UMI Company, May 1999).
Hirose et al., *High Speed Memory Behavior and Reliability of an Amorphous $As_2S_3$ Film Doped Ag,* Phys. Stat. Sol. (a) 61, pp. 87-90 (1980).
Hirose, Y.; Hirose, H., Polarity-dependent memory switching and behavior of Ag dendrite in Ag-photodoped amorphous As2S3 films, J. Appl. Phys. 47 (1976) 2767-2772.
Holmquist et al., *Reaction and Diffusion in Silver-Arsenic Chalcogenide Glass Systems,* 62 J. Amer. Ceram. Soc., No. 3-4, pp. 183-188 (Mar.-Apr. 1979).
Hong, K.S.; Speyer, R.F., Switching behavior in II-IV-V2 amorphous semiconductor systems, J. Non-Cryst. Solids 116 (1990) 191-200.
Hosokawa, S., Atomic and electronic structures of glassy GexSe1-x around the stiffness threshold composition, J. Optoelectronics and Advanced Materials 3 (2001) 199-214.
Hu, J.; Snell, A.J.; Hajto, J.; Owen A.E., Constant current forming in Cr/p+a−/Si:H/V thin film devices, J. Non-Cryst. Solids 227-230 (1998) 1187-1191.
Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.
Hu, J.; Snell, A.J.; Hajto, J.; Owen, A.E., Current-induced instability in Cr-p+a-Si:H-V thin film devices, Phil. Mag. B 80 (2000) 29-43.
Huggett et al., Developement of silver sensitized germanium selenide photoresist by reactive sputter etching in SF6, 42 Appl. Phys. Lett., No. 7, pp. 592-594 (Apr. 1983).
Iizima, S.; Sugi, M.; Kikuchi, M.; Tanaka, K., Electrical and thermal properties of semiconducting glasses As-Te-Ge, Solid State Comm. 8 (1970) 153-155.
Ishikawa, R.; Kikuchi, M., Photovoltaic study on the photo-enhanced diffusion of Ag in amorphous films of Ge2S3, J. Non-Cryst. Solids 35 & 36 (1980) 1061-1066.
Iyetomi, H.; Vashishta, P.; Kalia, R.K., Incipient phase separation in Ag/Ge/Se glasses: clustering of Ag atoms, J. Non-Cryst. Solids 262 (2000) 135-142.
Jones, G.; Collins, R.A., Switching properties of thin selenium films under pulsed bias, Thin Solid Films 40 (1977) L15-L18.
Joullie, A.M.; Marucchi, J., On the DC electrical conduction of amorphous As2Se7 before switching, Phys. Stat. Sol. (a) 13 (1972) K105-K109.
Joullie, A.M.; Marucchi, J., Electrical properties of the amorphous alloy As2Se5, Mat. Res. Bull. 8 (1973) 433-442.
Kaplan, T.; Adler, D., Electrothermal switching in amorphous semiconductors, J. Non-Cryst. Solids 8-10 (1972) 538-543.
Kawaguchi et al., *Mechanism of photosurface deposition,* 164-166 J. Non-Cryst. Solids, pp. 1231-1234 (1993).
Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.
Kawaguchi, T.; Masui, K., Analysis of change in optical transmission spectra resulting from Ag photodoping in chalcogenide film, Japn. J. Appl. Phys. 26 (1987) 15-21.
Kawamoto, Y.; Nishida, M., Ionic Condition in As2S3—Ag2S, GeS2—GeS—Ag2S and P2S5—Ag2S Glasses, J. Non-Cryst Solids 20(1976) 393-404.
Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.
Kluge, G.; Thomas, A.; Klabes, R.; Grotzschel, R., Silver photodiffusion in amorphous GexSe100-x, J. Non-Cryst. Solids 124 91990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin, R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTi chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K126-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bemede, J.C.; Benhida, S.; Abachi, T.; Latef, A., Electrical characterization of M/Se structures (M=Ni, Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.; Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical and conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses,* 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Scheuerlein, Roy, et al., A 10ns Read and Write Non-Volatile Memory Array Using a Magnetic Tunnel Junction and FET Switch in Each Cell, Digest of Technical Papers, 2000 IEEE Internat'l. Solid-State Circuits Conference, Session 7, Paper TA 7.2, Feb. 8, 2000, pp. 128 and 129.

\* cited by examiner

COMPLEMENTARY BIT RESISTANCE MEMORY SENSOR AND METHOD OF OPERATION

This application is a continuation of application Ser. No. 09/988,627, filed Nov. 20, 2001 now U.S. Pat. No. 6,791,859, the entire disclosure of which is incorporated herein by reference.

FIELD OF THE INVENTION

The invention relates to a method and apparatus for sensing the resistance of a Programmable Conductor Random Access Memory (PCRAM) element.

BACKGROUND OF THE INVENTION

PCRAM devices store binary data as two different resistance values, one higher than the other. The resistance value represents a particular binary value of logic "0" or logic "1". When sensing the resistance value of a PCRAM device, it is common to compare the resistance of a memory cell undergoing a read operation with resistance of a reference cell to determine the resistance value of the cell being read and thus its logic state. Such an approach is disclosed in U.S. Pat. No. 5,883,827. However, this approach has some limitations.

If the reference cell is defective and a column of memory cells within an array uses a same defective reference cell, the entire column of memory cells will have erroneous resistance readings. In addition, specialized circuitry is required to write a resistance value into the reference cell, and a sense amplifier circuit for such an arrangement tends to be complex and large.

Typically, sensing schemes for PCRAM devices also tend to have a unique architecture which is different from that normally employed in typical DRAM circuits. Although PCRAM's differ from DRAM's in that they store binary values in resistive memory elements rather than as charges on capacitors, and although PCRAM's are non-volatile, where the capacitor structures employed in DRAM's are volatile, nevertheless it would be desirable if the read and write circuits for both devices were as similar as possible so that existing DRAM memory device architectures could be easily adapted to read and write PCRAM devices.

BRIEF SUMMARY OF THE INVENTION

The present invention provides a PCRAM memory device and its method of operation which utilizes a read architecture similar to that employed in some DRAM memory devices. A pair of complementary PCRAM memory cells comprising first and second programmable conductor memory elements are employed, each connected to respective access transistors. During a write operation, the first and second memory elements are written with complementary binary values, that is: if the first memory element is written to a high resistance state, then the second memory element is written to a low resistance state; whereas if the first memory element is written to a low resistance state, the second memory element is written to a higher resistance state.

During a read operation of, for example, the first memory element, a sense amplifier is connected so that its respective inputs are coupled to receive respective precharge voltages which discharge through the first and second memory elements. A sense amplifier reads the discharging voltages through the two memory elements to determine which is the larger voltage, thus determining the resistance (high or low) and logic state (high or low) of the memory cell being read.

BRIEF DESCRIPTION OF THE DRAWINGS

These and other features and advantages of the invention will become more apparent from the following detailed description of exemplary embodiments of the invention which are provided in connection with the accompanying drawings in which.

DETAILED DESCRIPTION OF THE INVENTION

The present invention employs a sense amplifier architecture which is somewhat similar to that employed in some conventional DRAM devices to sense the resistance states of PCRAM memory cells. In the invention, a binary value is stored as a resistance value in a first PCRAM cell while its complement resistance value is stored in a second PCRAM cell. During readout of the first PCRAM cell, both PCRAM cells are used to discharge a precharge voltage into respective inputs of a sense amplifier which reads the discharge voltages to determine the resistance and thus the binary value stored in the first PCRAM cell undergoing a read operation.

Figure 1:
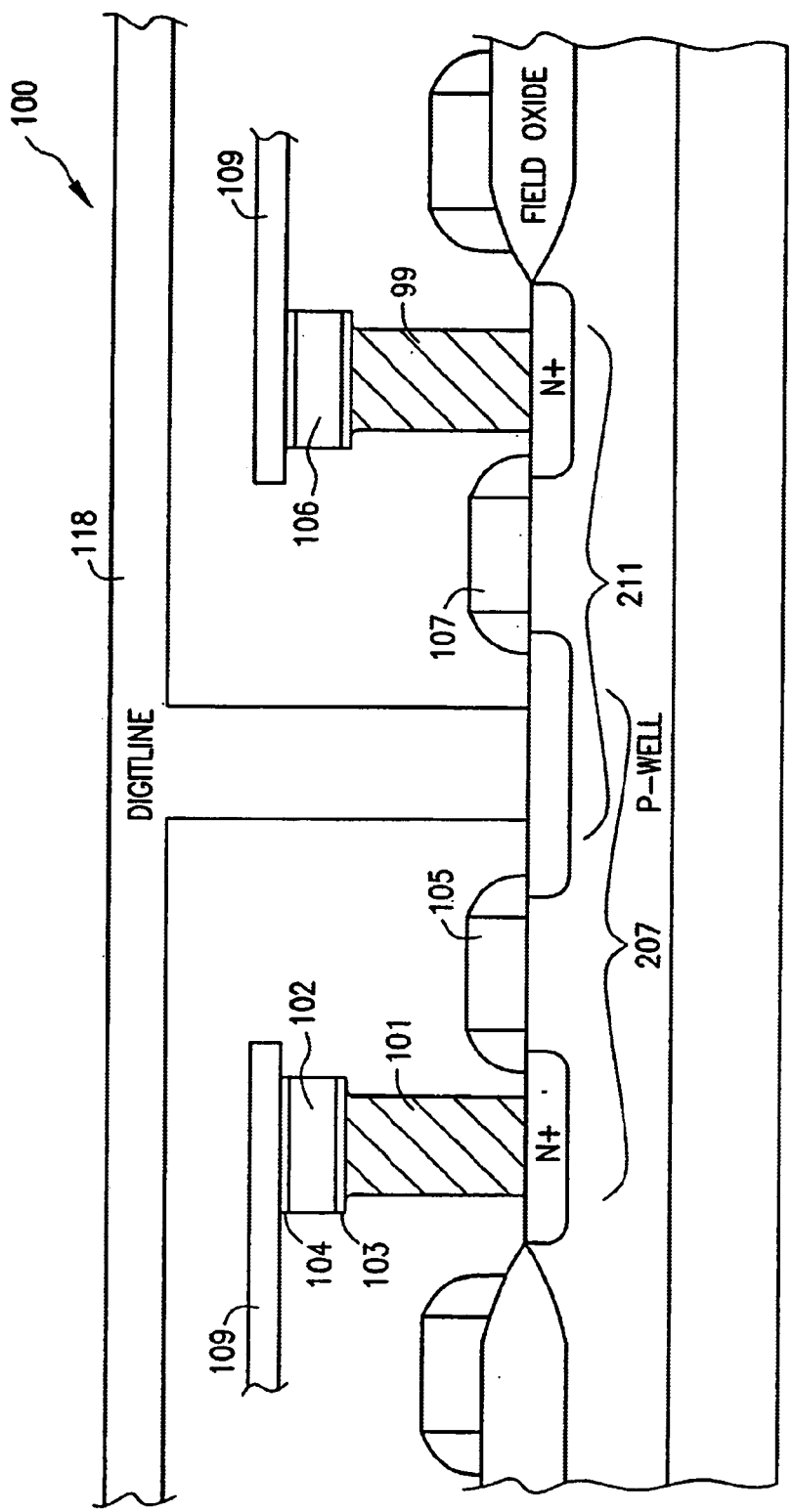
FIG. 1 shows an exemplary PCRAM device.

FIG. 1 illustrates an exemplary cell arrangement provided within a portion of a PCRAM memory device constructed in accordance with the invention. A PCRAM memory element 102 is illustrated which has a chalcogenite glass body and lower 103 and upper 104 conductors. As is well known, a programmable conductor memory element has two stable resistance states: one high resistance and one low resistance. Normally, when at rest the memory has a high resistance state, but it can be programmed to a low resistance state by suitably applying bias voltages to the conductors 103 and 104. Typically, the low resistant state of a PCRAM memory element is characterized by a dendrite growth through the chalcogenite glass body or along the surface of the chalcogenite glass body between the conductors 103 and 104. A high resistant state is present when there is no such dendrite growth. The grown dendrite is relatively non-volatile in that it will remain in place for a relatively long time, e.g. days or weeks, after the bias voltage is removed.

As further shown in FIG. 1, the PCRAM memory element 102 is coupled by a conductive plug 101 to an access transistor 207 which is driven by a word line 105 which forms the gate structure of transistor 207. The access transistor is coupled through conductive plug 101 to one of the conductors 103 of the PCRAM memory element. The other conductor 104 of the PCRAM element is connected by a common cell plate 109 to a bias voltage, which is common to other PCRAM memory elements provided in the memory device.

FIG. 1 illustrates a common PCRAM architecture in which two adjacent memory cells 207, 211 are coupled to a common digit line 118. Thus, FIG. 1 also shows another access transistor 211 driven by a word line 107 which is connected through conductive plug 99 to another PCRAM memory element 104, which in turn is also connected also to the common cell plate 109. Access transistor 211 also has one terminal connected to digit line 118.

Figure 2:
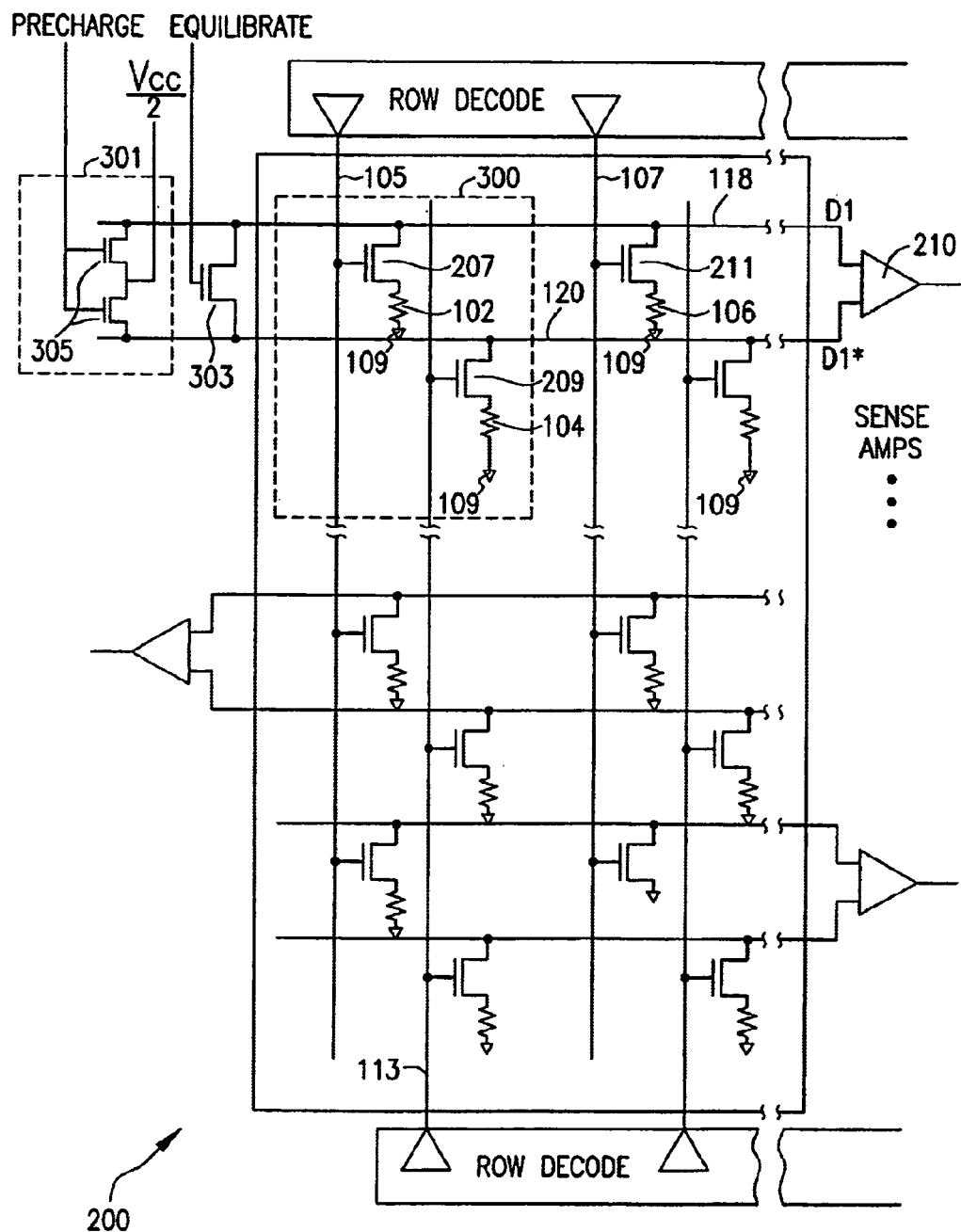
FIG. 2 is a schematic diagram depicting one aspect of the invention.

FIG. 2 shows an electrical schematic arrangement of a memory array employing the cell architecture illustrated in FIG. 1. Thus, the top portion of FIG. 2 illustrates the transistors 207 and 211 coupled to the respective PCRAM memory elements 102 and 106 with the access transistors 207 and 211 coupling the memory elements 102 and 106 to the digit line 118.

As also illustrated in FIG. 2, a complementary digit line D1 * 120 is also provided in the memory array, to which another set of access transistors is connected which are in turn connected to other PCRAM memory elements. To simplify discussion, a single complementary pair of PCRAM cells is illustrated as 300. It includes transistor 207 and associated PCRAM memory element 102, which is coupled to the digit line 118 (D1), and an access transistor 209 and associated PCRAM memory element 124, which are coupled to digit line 120 (D1*).

During a write operation, a row line 104, which is coupled to transistor 207 and a row line 113 which is coupled to transistor 209 are activated such that if PCRAM memory element 102 is written to a high resistance state, PCRAM element 124 is written to a low resistance state, and vice versa. In this way, PCRAM memory elements 102 and 124 are accessed together and always store complementary resistance digit values. Thus assuming that PCRAM memory element 102 is the primary element which is being written to and read from, a sense amplifier 210 which is coupled to the digit lines 118 and 120 will read the value of PCRAM memory element 102 by comparing a discharging precharge voltage on digit line 118 to the discharging precharge voltage on digit line 120 during a memory read operation.

Thus, prior to a memory read, a precharge voltage is applied to complementary digit lines 118 and 120 by a precharge circuit 301. The precharge circuit is activated by a logic circuit on a precharge line which activates transistors 305 to supply a voltage, for example, Vcc/2, to both digit lines 118 and 120.

Figure 3:
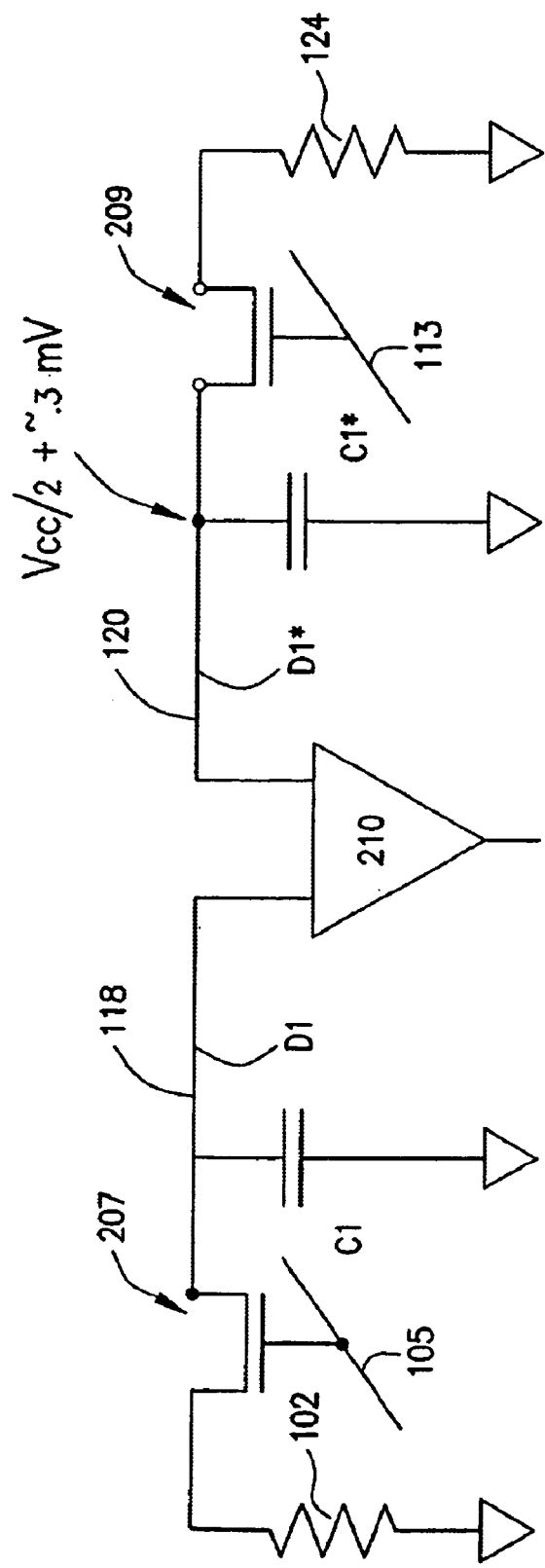
FIG. 3 is a schematic diagram depicting an additional aspect of the invention.

An equilibrate circuit 303 may also be provided which is activated by an equilibrate signal after the precharge circuit is activated to ensure that the voltages on lines 118 and 120 are the same. The voltages on lines 118 and 120 are held by a parasitic capacitance of the lines. After precharge and equilibrate (if present) circuits are activated, a read operation may be conducted on the complimentary cell pair 300. This read operation is illustrated in greater detail in FIG. 3, which is a simplification of the sense amplifier 210 input path.

Parasitic capacitance for the complementary digit lines 118 and 120 are illustrated as C1 and C1*. The respective access transistors 207 and 209 are illustrated as connected to their respective word lines 105 and 113. The PCRAM memory elements 102 and 124 are also illustrated. As noted, a binary value is stored, for example, in memory PCRAM memory element 102 as a resistance value. It will be either a high resistance value or a low resistance value, and the complementary resistance value will be stored in PCRAM memory element 124.

During a read operation, the precharge voltage applied to the complementary digit lines 118 and 120 is allowed to discharge through the access transistors 207 and 209 and through the respective resistance values of the PCRAM memory elements 102 and 124. Because the resistance values will be different, one high and one low, the voltages on the digit lines D1 and D1* (118, 120) will begin to diverge during a read operation. Although the voltage initially applied to the complementary digit lines 118 and 120 is a voltage of Vcc/2, during a read operation this voltage actually is slightly higher by approximately 0.3 mV due to the presence of the parasitic capacitance C1 and C1* on the digit lines 118 and 120, as well as gate-drain capacitance inherent within transistors 207 and 209.

Figure 5:
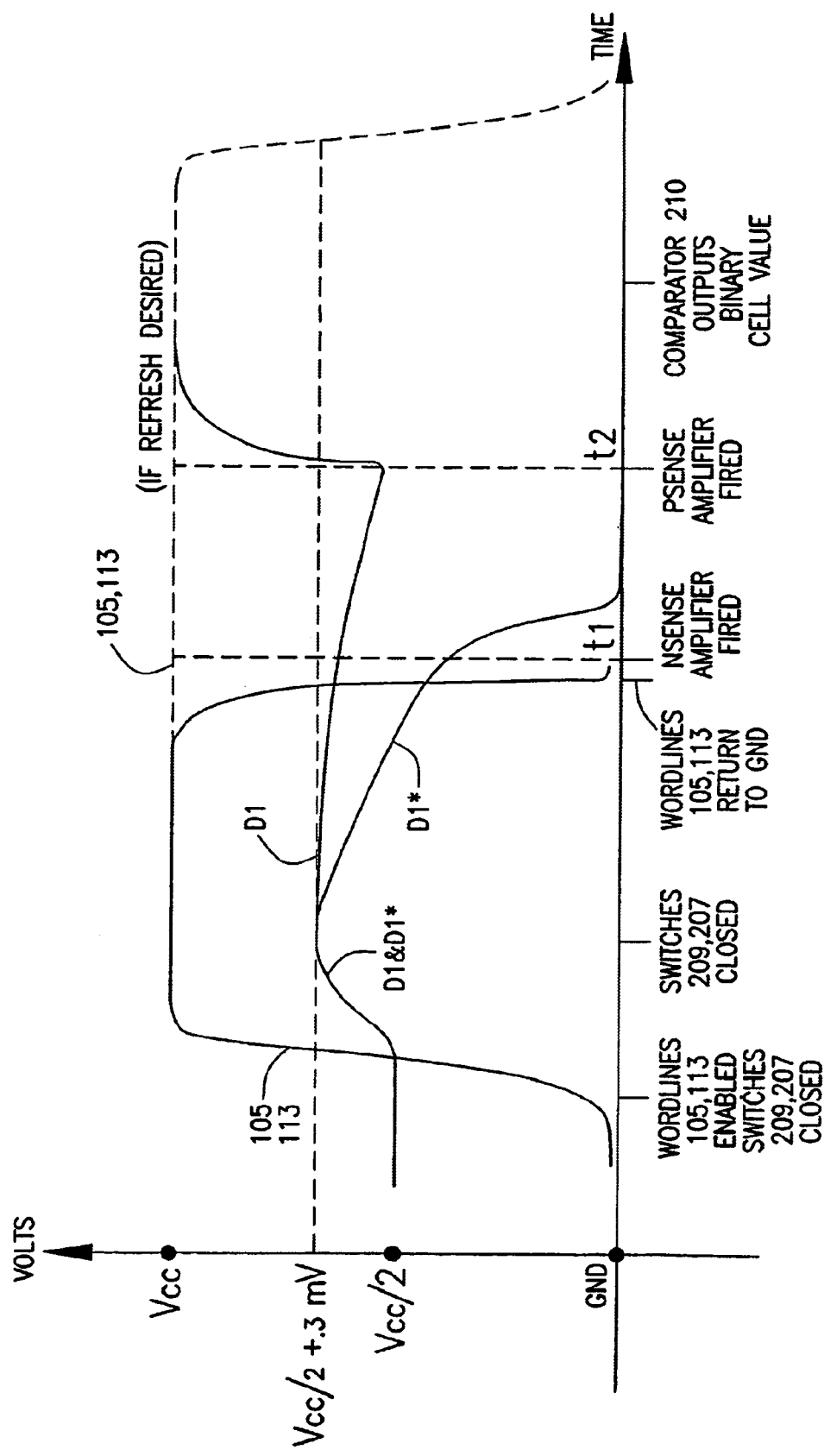
FIG. 5 shows the discharge rate characteristics of capacitors employed in the invention.

FIG. 5 illustrates the voltages on the complementary digit lines 118 and 120 during a read operation. The activation of the word lines 105 and 113 is illustrated as a pulse signal, and initially the voltage of Vcc/2+ approximately 0.3 mV which exists on both digit lines D1 and D1* begins to decay. Because one PCRAM memory element, e.g. 102, has a higher resistance than the other, the voltage on the digit line associated with the lower resistance value, e.g. 124, will decay faster than the voltage on the digit line coupled to the higher resistance value, e.g. D1. This is illustrated in FIG. 5.

Figure 4:
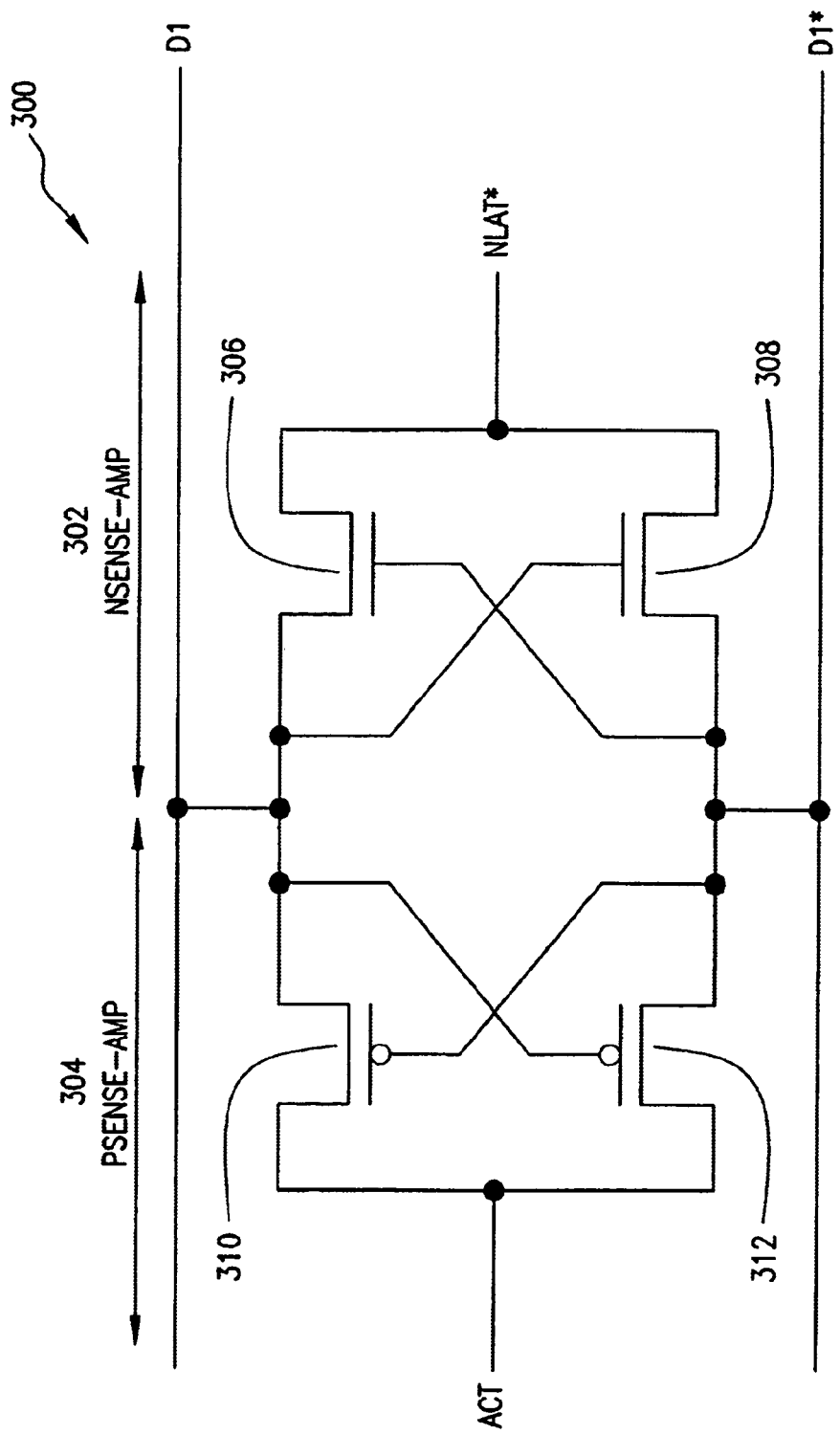
FIG. 4 is a schematic diagram depicting an additional aspect of the invention.

The divergence of the two voltages on the lines D1 and D1* progressively increases. At a predetermined time after the word lines 105 and 113 are activated, the sense amplifier 210 is activated. The sense amplifier can have an architecture typically employed in a DRAM arrangement which is illustrated in FIG. 4. Such a sense amplifier includes an Nsense amplifier latch 302 and a Psense amplifier latch 304. This structure is illustrated in FIG. 4.

Reverting back to FIG. 5, the N sense amplifier is fired first at a time t1. When the Nsense amplifier fires, the digit line which has the lower voltage, e.g. D1* in the example, is immediately pulled to ground. Thereafter, the Psense amplifier is fired at a time $t_2$ which drives the higher voltage line, e.g. D1, to Vcc. Accordingly at a time $t_2$, the sense amplifier 210 outputs a value of Vcc indicating the high resistant state for the PCRAM memory element 102.

Although FIG. 5 illustrates the signal timing which occurs when PCRAM memory element 102 has a higher resistance than memory element 104, obviously the signal levels are reversed if PCRAM memory element 102 has a low resistance state and PCRAM memory element 124 has a high resistance state. That is, the signal diagrams illustrated in the FIG. 5 would have the digit line D1* going towards Vcc and the digit line D1 going towards ground.

FIG. 5 also illustrates another aspect of the invention. As shown, the voltage for row lines 105, 113 increases from near ground level to a positive voltage near Vcc for a read operation. This voltage then returns to near ground level before the sense amplifier is enabled (before $t_1$). As a result, there is no rewriting of a read PCRAM memory element. If such rewriting of a PCRAM cell is desired, then the voltage on row line 105, 113 having a memory element which is written to a low resistance state, may be at a voltage level near Vcc during operation of the sense amplifier 210, which will automatically rewrite (refresh) the read cell to the low resistance state.

Because programmable contact memory elements are resistive rather than capacitive memory elements, it is possible they will take longer to pull the digit lines up to Vcc and to ground than a typical capacitive memory element found within a DRAM. Supposing that to be true, older DRAM sense amplifier designs that run somewhat slower than the latest generation of DRAM sense amplifiers could also be used with PCRAM memory cells. The advantage of doing so would be that these older DRAM sense amplifiers have already been shown to perform effectively, and their test infrastructure is already confirmed. Consequently, a hybrid memory consisting of PCRAM memory elements using DRAM sense amplifiers can be produced having the advantages of PCRAM technology, yet being producible quickly and inexpensively.

Although FIG. 2 shows the complementary programmable contact memory element 102 and 106 and associated access transistors and digit lines D and D* as being provided in the same memory array, the complementary memory elements, access transistors and digit lines may also be provided in respective different memory arrays.

Figure 6:
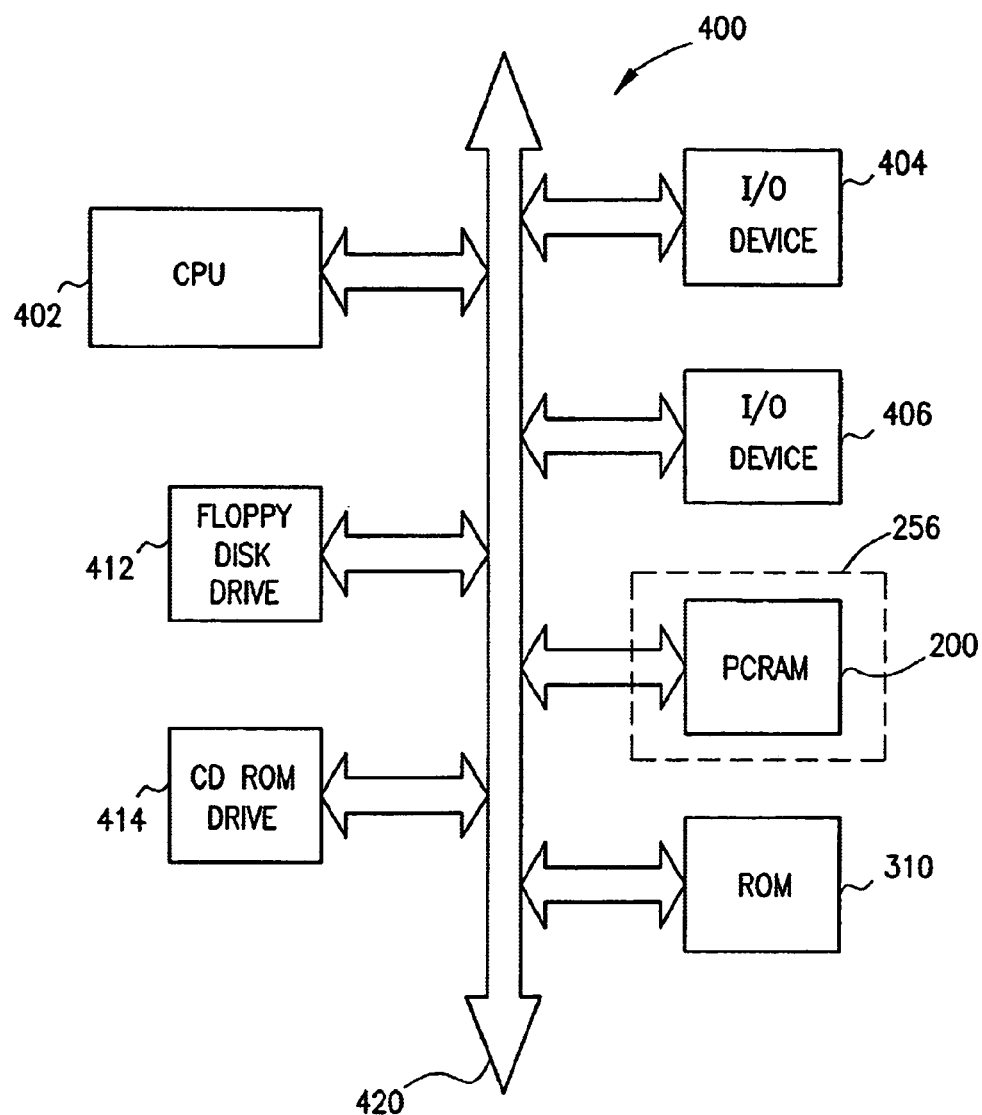
FIG. 6 shows the invention utilized in a computer system.

FIG. 6 is a block diagram of a processor-based system 400 utilizing a PCRAM memory device 200 constructed in accordance with one of the embodiments of the present invention. The processor-based system 400 may be a computer system, a process control system or any other system employing a processor and associated memory. The system 400 includes a central processing unit (CPU) 402, e.g., a microprocessor, that communicates with the PCRAM memory device 408 and an I/O device 404 over a bus 420. It must be noted that the bus 420 may be a series of buses and bridges commonly used in a processor-based system, but for convenience purposes only, the bus 420 has been illustrated as a single bus. A second I/O device 406 is illustrated, but is not necessary to practice the invention. The processor-based system 400 also includes read-only memory (ROM) 410 and may include peripheral devices such as a floppy disk drive 412 and a compact disk (CD) ROM drive 414, that also communicates with the CPU 402 over the bus 420 as is well known in the art.

One or more memory devices 200 may be provided on a plug-in memory module 256, e.g. SIMM, DIMM or other plug-in memory module, for easy connection with or disconnection from the bus 420. While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A programmable resistance memory device, comprising:
    a first and second digit line;
    first and second programmable resistance memory elements associated with a single memory cell for respectively storing complementary binary digit values of a data bit as different resistance values;
    first and second access devices for respectively coupling said first and second memory elements to said first and second digit lines; and
    a sense amplifier having inputs respectively coupled to said first and second digit lines for reading said data bit stored as a resistance value in one of said memory elements.

2. The device as in claim 1 further comprising a precharge circuit for precharging said digit lines to a common precharge voltage prior to a read operation.

3. The device as in claim 1 further comprising a pair of row lines respectively coupled to said first and second access devices; and
    circuitry for simultaneously activating said first and second row lines and therefore activating said first and second access devices.

4. The device as in claim 3 wherein said first and second access devices are access transistors.

5. The device as in claim 3 wherein when said access devices are activated, said precharge voltage on said digit lines discharges through a respective resistance of said first and second resistance-based memory elements, said sense amplifier determining whether said one of said memory elements is storing a high or low resistance state and outputting a binary value corresponding to the stored resistance state.

6. The device as in claim 2 wherein said digit lines have an associated parasitic capacitance which stores said precharge voltage.

7. The device as in claim 2 wherein said parasitic capacitance stores a voltage value which is larger than said precharge voltage.

8. The device as in claim 3 wherein said row lines are activated in a manner which prevents an automatic refresh of at least one of said memory elements during a read operation.

9. The device as in claim 1 wherein said first and second memory elements are in different memory arrays.

10. The device as in claim 2 further comprising an equilibrate circuit for equilibrating the voltage on said digit lines.

11. A memory device comprising:
    a plurality of pairs of first and second programmable resistance memory cells, each pair of memory cells comprising:
    first and second programmable resistance memory elements associated with a single memory cell for respectively storing complementary binary digit values of a data bit as different resistance values;
    first and second access devices for respectively coupling said first and second memory elements to first and second digit lines; and
    a sense amplifier having inputs respectively coupled to said first and second digit lines for reading said data bit stored as a resistance value in one of said memory elements.

12. The device as in claim 11 further comprising a precharge circuit for precharging said digit lines to a common precharge voltage prior to a read operation.

13. The device as in claim 11 further comprising a pair of row lines respectively coupled to said first and second access devices; and
    circuitry for simultaneously activating said first and second row lines and therefore activating said first and second access devices.

14. The device as in claim 13 wherein said first and second access devices are access transistors.

15. The device as in claim 13 wherein when said access devices are activated, said precharge voltage on said digit lines discharges through a respective resistance of said first and second programmable resistance memory elements, said sense amplifier determining whether said one of said memory elements is storing a high or low resistance state and outputting a binary value corresponding to the stored resistance state.

16. The device as in claim 15 wherein said digit lines have an associated parasitic capacitance which stores said precharge voltage.

17. The device as in claim 15 wherein said parasitic capacitance stores a voltage value which is larger than said precharge voltage.

18. The device as in claim 11 wherein said first and second memory elements are in a common memory array.

19. The device as in claim 11 wherein said first and second memory elements are in different memory arrays.

20. The device as in claim 12 further comprising an equilibrate circuit for equilibrating the precharge voltage on said digit lines.

21. The device as in claim 11 wherein said memory device is provided on a memory module.

22. The device as in claim 21 wherein said memory module is a plug-in memory module.

23. A computer system comprising:
a processor;
a memory system coupled to said processor, said memory system comprising:
a first and second digit line;
first and second programmable resistance memory elements associated with a single memory cell for respectively storing complementary binary digit values of a data bit as different resistance values;
first and second access devices for respectively coupling said first and second programmable resistance memory elements to said first and second digit lines; and
a sense amplifier having inputs respectively coupled to said first and second digit lines for reading said data bit stored as a resistance value in one of said memory elements.

24. The system as in claim 23 further comprising a precharge circuit for precharging said digit lines to a common precharge voltage prior to a read operation.

25. The system as in claim 23 further comprising a pair of row lines respectively coupled to said first and second access devices; and
circuitry for simultaneously activating said first and second row lines and therefore activating said first and second access devices.

26. The system as in claim 25 wherein said first and second access devices are access transistors.

27. The system as in claim 25 wherein when said access devices are activated, said precharge voltage on said digit lines discharges through a respective resistance of said first and second memory elements, said sense amplifier determining whether said one of said memory elements is storing a high or low resistance state and outputting a binary value corresponding to the stored resistance state.

28. The system as in claim 24 wherein said digit lines have an associated parasitic capacitance which stores said precharge voltage.

29. The system as in claim 24 wherein said parasitic capacitance stores a voltage value which is larger than said precharge voltage.

30. The system as in claim 23 wherein said first and second memory elements are in a common memory array.

31. The system as in claim 23 wherein said first and second memory elements are in different memory arrays.

32. The system as in claim 24 further comprising an equilibrate circuit for equilibrating the voltage on said digit lines.

* * * * *

UNITED STATES PATENT AND TRADEMARK OFFICE
CERTIFICATE OF CORRECTION

| | | |
|---|---|---|
| PATENT NO. | : 7,002,833 B2 | Page 1 of 2 |
| APPLICATION NO. | : 10/866091 | |
| DATED | : February 21, 2006 | |
| INVENTOR(S) | : Glen Hush et al. | |

It is certified that error appears in the above-identified patent and that said Letters Patent is hereby corrected as shown below:

Column 4, line 28, "t1" should read --$t_1$--.

Item (56), References Cited, Other Publications, the following errors are corrected:

"Boolchand, P., The maximum in glass transition temperature (Tg) near=1/3 ln $Ge_xSe_{1-x}$ Glasses, Asian Journal of Physics (2000) 9, 709-72."

Should read

--Boolchand, P., The maximum in glass transition temperature (Tg) near x=1/3 ln $Ge_xSe_{1-x}$ Glasses, Asian Journal of Physics (2000) 9, 709-72.--;

"Deamaley, G.; Stoneham, A.M.; Morgan, D.V., Electrical phenomena in amorphous oxide films, Rep. Prog. Phys. 33 (1970) 1129-1191."

Should read

--Dearnaley, G.; Stoneham, A.M.; Morgan, D.V., Electrical phenomena in amorphous oxide films, Rep. Prog. Phys. 33 (1970) 1129-1191.--;

"Kotkata, M.F.; Afif, M.A.; Labib, H.H.; Hegab, N.A.; Abdel-Aziz, M.M., Memory switching in amorphous GeSeTi chalcogenide semiconductor films, Thin Solid Films 240 (1994) 143-146."

Should read

--Kotkata, M.F.; Afifi, M.A.; Labib, H.H.; Hegab, N.A.; Abdel-Aziz, M.M., Memory switching in amorphous GeSeTi chalcogenide semiconductor films, Thin Solid Films 240 (1994) 143-146.--;

"McHardy, et al., The dissolution of metals in amorphous chalcogenides and the effects o electron and ultraviolet radiation, 20 J. Phys. C.: Solid State Phys., pp. 4055-4075 (1987)f."

Should read

--McHardy, et al., The dissolution of metals in amorphous chalcogenides and the effects of electron and ultraviolet radiation, 20 J. Phys. C.: Solid State Phys., pp. 4055-4075 (1987).--;

UNITED STATES PATENT AND TRADEMARK OFFICE
CERTIFICATE OF CORRECTION

PATENT NO. : 7,002,833 B2
APPLICATION NO. : 10/866091
DATED : February 21, 2006
INVENTOR(S) : Glen Hush et al.

It is certified that error appears in the above-identified patent and that said Letters Patent is hereby corrected as shown below:

"Rose, M.J.; Snell, A.J.; Lecomber, P.G.; Hajto, J.; Fitzgerald, A.G.; Owen, A.E., Aspects of non-volatility in a –Si:H memory devices, Mat. Res. Soc. Symp. Proc. V 258, 1992, 1075-1080."

Should Read

--Rose, M.J.; Snell, A.J.; Lecomber, P.G.; Hajto, J.; Fitzgerald, A.G.; Owen, A.E., Aspects of non-volatility in metal/a –Si:H memory devices, Mat. Res. Soc. Symp. Proc. V 258, 1992, 1075-1080.--;
and "Tranchant, S.; Peytavin, S.; Ribes, M.; Flank, A.M.; Dexpert, H.; Lagarde, J.P., Silver chalcogenide glasses Ag-Ge-Se: Ionic conduction and exafs structural investigation, Transport-structure relations in fast ion and mixed conductors Proceedings of the 6th Riso International, Symposium. Sep. 9-13, 1985."

Should Read

--Tranchant, S.; Peytavin, S.; Ribes, M.; Flank, A.M.; Dexpert, H.; Lagarde, J.P., Silver chalcogenide glasses Ag-Ge-Se: Ionic conduction and EXAFS structural investigation, Transport-structure relations in fast ion and mixed conductors, Proceedings of the 6th RISO International Symposium. Sep. 9-13, 1985.--.

Signed and Sealed this

Eighth Day of August, 2006

JON W. DUDAS
*Director of the United States Patent and Trademark Office*